United States Patent
Shida et al.

(10) Patent No.: US 9,947,429 B2
(45) Date of Patent: Apr. 17, 2018

(54) AG ALLOY FILM FOR REFLECTING ELECTRODE OR WIRING ELECTRODE, REFLECTING ELECTRODE OR WIRING ELECTRODE, AND AG ALLOY SPUTTERING TARGET

(71) Applicant: KOBE STEEL, LTD., Kobe-shi (JP)

(72) Inventors: Yoko Shida, Kobe (JP); Hiroshi Goto, Kobe (JP); Mototaka Ochi, Kobe (JP)

(73) Assignee: Kobe Steel, Ltd., Kobe-shi (JE)

( * ) Notice: Subject to any disclaimer, the term of this patent is extended or adjusted under 35 U.S.C. 154(b) by 79 days.

(21) Appl. No.: 14/889,334

(22) PCT Filed: Jun. 11, 2014

(86) PCT No.: PCT/JP2014/065518
§ 371 (c)(1),
(2) Date: Nov. 5, 2015

(87) PCT Pub. No.: WO2014/208341
PCT Pub. Date: Dec. 31, 2014

(65) Prior Publication Data
US 2016/0104549 A1 Apr. 14, 2016

(30) Foreign Application Priority Data
Jun. 26, 2013 (JP) .................. 2013-134344

(51) Int. Cl.
*B32B 15/04* (2006.01)
*H01B 1/02* (2006.01)
(Continued)

(52) U.S. Cl.
CPC ................ *H01B 1/02* (2013.01); *C22C 5/06* (2013.01); *C22F 1/00* (2013.01); *C22F 1/14* (2013.01);
(Continued)

(58) Field of Classification Search
None
See application file for complete search history.

(56) References Cited

U.S. PATENT DOCUMENTS 7,517,575 B2 4/2009 Fujii et al.
7,695,792 B2 * 4/2010 Tauchi ................ C22C 5/06
428/64.1
(Continued)

FOREIGN PATENT DOCUMENTS

CN 1483852 A 3/2004
CN 1280446 C 10/2006
(Continued)

OTHER PUBLICATIONS

International Search Report and Written Opinion of the International Searching Authority dated Sep. 22, 2014 in PCT/JP14/65518 Filed Jun. 11, 2014.

*Primary Examiner* — Seth Dumbris
(74) *Attorney, Agent, or Firm* — Oblon, McClelland, Maier & Neustadt, L.L.P.

(57) ABSTRACT

An Ag alloy film used for a reflecting electrode or an interconnection electrode, the Ag alloy film exhibiting low electrical resistivity and high reflectivity and having exceptional oxidation resistance under cleaning treatments such as an $O_2$ plasma treatment or UV irradiation, wherein the Ag alloy film contains either In in an amount of larger than 2.0 atomic % to 2.7 atomic % or smaller; or Zn in an amount of larger than 2.0 atomic % to 3.5 atomic % or smaller; or both. The Ag alloy film may further contain Bi in an amount of 0.01 to 1.0 atomic %.

8 Claims, 2 Drawing Sheets

(51) Int. Cl.
*C23C 14/34* (2006.01)
*C22C 5/06* (2006.01)
*C22F 1/00* (2006.01)
*C22F 1/14* (2006.01)
*H01L 23/532* (2006.01)
*C23C 14/18* (2006.01)
*H01J 37/34* (2006.01)
*H01L 51/52* (2006.01)

(52) U.S. Cl.
CPC ........ *C23C 14/185* (2013.01); *C23C 14/3414* (2013.01); *H01J 37/3429* (2013.01); *H01L 23/53247* (2013.01); *H01L 51/5218* (2013.01); *H01L 2924/0002* (2013.01); *Y10T 428/12896* (2015.01)

(56) References Cited

U.S. PATENT DOCUMENTS

| | | | |
|---|---|---|---|
| 7,713,608 B2 | 5/2010 | Nakai et al. | |
| 8,399,100 B2 | 3/2013 | Suzuki et al. | |
| 8,444,777 B2 | 5/2013 | Hata et al. | |
| 2004/0028912 A1 | 2/2004 | Tauchi et al. | |
| 2004/0226818 A1 | 11/2004 | Takagi et al. | |
| 2004/0253137 A1* | 12/2004 | Gehlert | C22C 5/06 420/501 |
| 2005/0238839 A1 | 10/2005 | Takagi et al. | |
| 2006/0104853 A1 | 5/2006 | Tauchi et al. | |
| 2006/0154104 A1 | 7/2006 | Tauchi et al. | |
| 2006/0171842 A1 | 8/2006 | Tauchi et al. | |
| 2006/0182991 A1 | 8/2006 | Tauchi et al. | |
| 2007/0096614 A1* | 5/2007 | Shin | H01L 51/5218 313/112 |
| 2008/0317993 A1 | 12/2008 | Tauchi et al. | |
| 2009/0061142 A1 | 3/2009 | Tauchi et al. | |
| 2009/0117313 A1 | 5/2009 | Tauchi et al. | |
| 2010/0038233 A1 | 2/2010 | Takagi et al. | |
| 2010/0195231 A1 | 8/2010 | Suzuki et al. | |
| 2011/0042135 A1 | 2/2011 | Tauchi et al. | |
| 2011/0220903 A1 | 9/2011 | Tauchi et al. | |
| 2012/0196118 A1 | 8/2012 | Tauchi et al. | |
| 2014/0342104 A1* | 11/2014 | Tauchi | C22C 5/06 428/1.4 |

FOREIGN PATENT DOCUMENTS

| | | |
|---|---|---|
| CN | 1331138 C | 8/2007 |
| CN | 102165846 A | 8/2011 |
| JP | 8-203335 | 8/1996 |
| JP | 2004-126497 A | 4/2004 |
| JP | 2004-131747 A | 4/2004 |
| JP | 2004-139712 A | 5/2004 |
| JP | 2004-263290 A | 9/2004 |
| JP | 2005-100604 | 4/2005 |
| JP | 2005-332557 A | 12/2005 |
| JP | 2010-225586 A | 10/2010 |
| JP | 2012-219308 A | 11/2012 |
| JP | 2013-151735 A | 8/2013 |
| WO | 2009-041529 A1 | 4/2009 |

* cited by examiner

ITO-10nm/Ag-0.1Bi-2.88Zn-100nm/ITO-10nm

ITO-10nm/Ag-100nm/ITO-10nm

AG ALLOY FILM FOR REFLECTING ELECTRODE OR WIRING ELECTRODE, REFLECTING ELECTRODE OR WIRING ELECTRODE, AND AG ALLOY SPUTTERING TARGET

TECHNICAL FIELD

The present invention is related to an Ag alloy film for a reflecting electrode or an interconnection electrode, a reflecting electrode or an interconnection electrode, an Ag alloy sputtering target for deposition of the Ag alloy film for the reflecting electrode or the interconnection electrode, a display device or a lighting device comprising the reflecting electrode, and a touch panel comprising the interconnection electrode. The Ag alloy film according to the present invention has a low electrical resistivity, a high reflectance, and excellent resistance to oxidation in the course of a cleaning treatment such as an UV irradiation or an $O_2$ plasma treatment, which is one of the manufacturing processes of the display panel. A display device having excellent characteristics or the like may be attained, accordingly.

BACKGROUND ART

Since an Ag alloy film in which Ag is the main component of a certain thickness or larger has a high reflectance in visible light and a low electrical resistance, it is expected to applicable to a reflecting electrode of a liquid crystal display device, an organic EL display device, or the like.

An Ag alloy film, however, does not form a passivation film and is susceptible to external effects. Specifically, an Ag alloy reacts with sulfur to form silver sulfide and reacts with halogen to form silver halide. An Ag alloy is also liable to be agglomerated by being subjected to heating.

The Ag alloy film thus has a problem of degradation in terms of the high reflectance and the low electrical resistance, which are inherent characteristics of an Ag alloy film, upon being subjected to a thermal hysteresis in the course of manufacturing process of the display device or the like. Novel Ag films having those different from conventional alloying compositions have been proposed by taking the problem regarding the Ag alloy film into consideration.

Patent Document 1, for example, discloses an Ag alloy film comprising one or two kinds of element selected from a group consisting of Bi and Sb in a total amount of 0.01 to 4 atomic %, which has a high reflectance inherent in Ag and circumvents the degradation in terms of reflectance with time by suppressing agglomeration and crystal grain growth.

Patent Document 2 discloses an Ag-based alloy film constituting a reflecting anode electrode in an organic EL display device. It is demonstrated by adding 0.01 to 1.5 atomic % of Nd or 0.01 to 4 atomic % of Bi to the Ag-based alloy film that the dark spot phenomenon in an organic EL display device can be successfully circumvented by exertion of the effect of the elements to prevent agglomeration of Ag.

Patent Document 3 discloses that a high reflectance can be achieved by adding Bi to Ag to suppress crystal grain growth and agglomeration in an Ag film as well as by further adding V, Ge, and Zn within a range which satisfies a predetermined expression.

Patent Document 4 discloses that an Ag-based alloy having heat resistance and corrosion resistance may be attained by containing a predetermined small amount of Cu and Te/Se, and further adding In, Sn, Zn, Pd, Au, Pt, Ru, Ir, Fe, Ni, Bi, and P as needed. Patent Document 5 indicates an improvement in terms of heat resistance in an Ag alloy film obtained by using a target which is prepared by adding a specific small amount of Bi along with In, Sn, Zn, Au, Pd, and Pt.

The Ag film is generally subjected to a cleaning treatment such as an UV irradiation or an $O_2$ plasma treatment after deposition in the manufacturing process of the display panel. The treatment, however, causes a problem of oxidation and blackening Ag. The blackening is induced by chemical reaction of Ag with highly reactive oxygen radicals produced in the course of the UV or $O_2$ plasma irradiation.

In a top-emission type OLED display panel in which the light is emitted from the opposite side of the substrate, an organic material layer is laminated on top of a reflecting electrode consisting of a single layer Ag alloy film or a reflecting electrode comprising an Ag alloy film. For the purpose of securing electrical connection of the reflecting electrode with the organic material, the surface of the reflecting electrode is always cleaned by being subjected to the treatment such as an UV irradiation or an $O_2$ plasma treatment prior to the deposition of the organic material in the course of the manufacturing process of the display panel.

The Ag film, however, has a problem of forming silver oxide and being blackened upon being subjected to an UV irradiation or an $O_2$ plasma treatment as described above. The formed silver oxide causes a short-circuited device element. When the resistance to oxidation is not high, production yield of the device element is deteriorated.

The formation of a silver oxide is attributed to the fact that Ag is liable to be oxidized by active oxygen generated by an UV irradiation or an $O_2$ plasma treatment because Ag does not form a passivation as described above.

In order to suppress the deterioration, specifically the blackening of Ag alloy films by the oxidation, upon being subjected to the cleaning treatment, a means to protect the Ag film is employed by depositing either a transparent conductive oxide film such as ITO or an oxide film either directly on or directly beneath the Ag film. Even if the ITO or the like is laminated on and beneath an Ag alloy film in such a manner, there is a case in which the Ag film is incompletely protected and deteriorated upon being subjected to the cleaning treatment due to causes such as non-uniformity in thickness or presence of pinholes in the ITO film or the like. Then silver oxide is formed and the reflectance is deteriorated. It is thus required for the Ag alloy film itself to have excellent resistance to the cleaning treatment such as an UV irradiation and an $O_2$ plasma treatment, that is, resistance to active oxygen (occasionally referred to as resistance to oxidation hereinbelow).

DESCRIPTION OF THE RELATED ART

Patent Documents

Patent Document 1: Japanese Patent Application Publication No. 2004-126497
Patent Document 2: Japanese Patent Application Publication No. 2010-225586
Patent Document 3: International Patent Application Publication No. 2009/041529
Patent Document 4: Japanese Patent Application Publication No. 2006-342416
Patent Document 5: Japanese Patent Application Publication No. 2005-048231

SUMMARY OF THE INVENTION

Problems to be Solved by the Invention

It is required for the Ag based film to have low electrical resistivity and high reflectance which are necessary for a reflecting electrode or an interconnection electrode as well as to have excellent oxidation resistance. Previously proposed Ag alloy films of various kinds cannot fulfill all of the characteristics.

The present invention has been made in light of the circumstances described above. It is a particular object of the present invention to provide an Ag alloy film for use in a reflecting electrode or an interconnection electrode, having low electrical resistivity, a high reflectance, and oxidation resistance superior to Ag, and a reflecting electrode or an interconnection electrode comprising the Ag alloy film. It is also an object of the present invention to provide an Ag alloy sputtering target used for depositing an Ag alloy film for the reflecting electrode or the interconnection electrode. Further, it is also an object of the present invention to provide a display device, a touch panel, and a lighting device, which comprises the reflecting electrode or the interconnection electrode.

Solution to Problem

The Ag alloy film which can solve the problem and be used for a reflecting electrode or an interconnection electrode comprises; In in an amount of larger than 2.0 atomic % and smaller than or equal to 2.7 atomic %.

In a preferred embodiment of the present invention, the Ag alloy film further comprises Bi an amount of 0.01 to 1.0 atomic %.

The reflecting electrode or the interconnection electrode according to the present invention has a transparent conductive film of 5 nm or larger and smaller than 25 nm in thickness formed either directly on the Ag alloy film or directly on and directly beneath the Ag alloy film.

In a preferred embodiment of the present invention, the transparent conductive film is either ITO or IZO.

The Ag alloy sputtering target according to the present invention, used for deposition of one of the Ag alloy films, comprises In in an amount of larger than 2.0 atomic % and smaller than or equal to 2.7 atomic %;

In a preferred embodiment of the present invention, the Ag alloy sputtering target further comprises Bi an amount of 0.01 to 2.0 atomic %.

The present invention also encompasses a display device, a touch panel, and a lighting device, which comprises the reflecting electrode or the interconnection electrode described above.

Effects of the Invention

According to the present invention, an Ag alloy film having a low electrical resistivity, a high reflectance, and excellent resistance to oxidation in the course of a cleaning treatment such as an UV irradiation or an $O_2$ plasma treatment may be attained. Therefore, by using the Ag alloy film of the present invention, a display panel having a superior display characteristic or the like can be manufactured with high productivity.

MODE FOR CARRYING OUT THE INVENTION

Figure 1A:
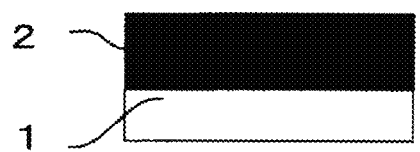
FIG. 1A A schematic cross-sectional figure indicating a structure of a reflecting electrode or an interconnection electrode according to the present invention. Illustrated is a structure in which an Ag alloy film is formed directly on a substrate.

Intensively pursued by the present inventors was an Ag alloy film for use in a reflecting electrode or an interconnection electrode, having a low electrical resistivity, a high reflectance, and excellent resistance to oxidation resistance, even if the Ag alloy film was applied to a reflecting electrode or an interconnection electrode of a display device, a touch panel, or a lighting device which is manufactured by a process comprising a cleaning process such as an UV irradiation or an $O_2$ plasma treatment after forming the electrode. It was then found as a result that the expected purpose can be achieved by using an Ag alloy film comprising In in a predetermined amount (occasionally abbreviated as Ag—In alloy hereinbelow); or an Ag film further comprising Bi in a predetermined amount (occasionally abbreviated as Ag—In—Bi alloy hereinbelow).

In a reflecting electrode for an OLED display, for example, transparent conductive films are laminated on and beneath an Ag alloy film to protect the Ag alloy film as described above. Even when the transparent conductive film is laminated, there is a case in which Ag is oxidized and defects in a form of dark dot are generated upon being subjected to a cleaning treatment such as an UV irradiation and an $O_2$ plasma treatment due to causes such as non-uniformity in thickness or presence of pinholes in the transparent conductive film. The generation of dark spots causes short-circuiting in a light emission layer of OLED and deterioration of production yield. The present inventors found that, among a variety of alloying elements composing Ag alloy films, In is particularly effective to securing all of a low electrical resistivity, a high reflectance, and excellent resistance to oxidation, and that the resistance to oxidation can be improved further by adding Bi.

On the bases of the finding, the present inventors have filed Japanese Patent Application 2012-229083 before filing the present patent application. An upper limit of content of In was strictly specified to 2.0 atomic % in Japanese Patent Application 2012-229083 from the point of view to securing the low electrical resistivity and the high reflectance that are almost at the same levels as those of a pure Ag film. In the present invention, on the other hand, the acceptance standard with respect to electrical resistivity and reflectance have been slightly loosened from the point of view to keeping the minimum level which are applicable to a reflecting electrode or an interconnection electrode. Putting emphasis on the improving the resistance to oxidation, and from the point of view to widely providing a reflecting electrode or an interconnection electrode which is useful as an oxidation protecting film in the course of an LTV irradiation or an $O_2$ plasma treatment, range of In is specified to larger than 2.0 atomic % and smaller than or equal to 2.7 atomic % in the present invention, which is not overlapping with that of the prior application.

The Ag alloy film for a reflecting electrode or an interconnection electrode according to the present invention comprises In in a predetermined amount. As disclosed in embodiments, when amount of In in the alloy is larger, the resistance to oxidation depicts a trend of improvement. However, excessively large amount of In increases the electrical resistivity. By taking the balance into consideration, range of In is specified to larger than 2.0 atomic % and smaller than or equal to 2.7 atomic %. Preferably, In is smaller than or equal to 2.5 atomic %.

The Al alloy film of the present invention for a reflecting electrode or an interconnection electrode may further comprise Bi, by which the resistance to oxidation is further improved. In order to exert the effect of Bi, it is preferred for the Ag alloy to contain Bi in an amount of 0.01 atomic % or larger. The content of Bi is more preferably 0.05 atomic % or larger. On the other hand, the content of Bi is preferably controlled to 1.0 atomic % or smaller because excessive content of Bi in the Ag alloy results in increase of electrical resistivity and decrease of reflectance as for the case in which In is contained. The content of Bi is more preferably 0.8 atomic % or smaller, and even more preferably 0.5 atomic % or smaller.

The Ag alloy film according to the present invention comprises the element, and the balance being Ag and inevitable impurities.

The present inventors also found that high resistance to oxidation can be imparted to an Ag—In—Bi film, preferably having Bi in an amount of 0.01 to 0.5 atomic %, by forming a portion (highly concentrated layer) where content of In was larger than 2.0 atomic % as well as an average content in the Ag alloy on the surface, and by protecting the film surface using the highly concentrated layer instead of a passivation film. It is noted here that the average content in the Ag alloy film is represented by an average content in the Ag alloy film where the highly concentrated layer is included.

In order to sufficiently exert the effect and obtain the excellent resistance to oxidation, it is preferred for the highly concentrated layer to have a thickness of 1 nm or larger in the thickness direction from the outer most surface of the Al alloy film. The thickness of the highly concentrated layer is more preferably 2 nm or larger. When the highly concentrated layer is excessively thick, on the other hand, it becomes difficult to maintain the high reflectance. It was found according to experimental results obtained by the present inventors that the reflectance did not reach the acceptance standard of the present invention, which is described below, when a zinc oxide layer corresponding to the highly concentrated layer is larger than 10 nm in thickness. The highly concentrated layer is preferably 10 nm or smaller, and more preferably 7 nm or smaller in thickness.

In order to form the highly concentrated layer, an amount of In contained in an Ag alloy film may be adjusted, or the Ag alloy film may be subjected to air. In addition, the formation of the highly concentrated layer may be enhanced by subjecting the Ag alloy film to a heat treatment, for example, at a heating temperature of 150 to 350° C. for a heating time of 0.5 to 1.5 hour in a $N_2$ atmosphere.

Thickness of the Ag alloy film according to the present invention is preferably 30 to 200 nm. The high reflectance may be secured by making the film thickness 30 nm or larger that makes transparency of the Ag alloy film nearly equal to zero. The film thickness is preferably 50 nm or larger. On the other hand, excessively large thickness of the Ag alloy film is liable to cause delamination of the film and prolonged period of time for deposition of the film, deteriorating the productivity. The film thickness is thus preferably 200 nm or smaller, and more preferably 150 nm or smaller. It is noted here that film thickness includes that of a highly concentrated layer when the highly concentrated layer is formed.

The Ag alloy film is preferably formed by a sputtering method with a sputtering target. This is because a sputtering method is excellent in terms of ease of alloying, productivity, and in-plane uniformity in thickness, and preferred among various methods to deposit a thin film such as inkjet coating method, vacuum evaporation method, and sputtering method. By a sputtering method, the alloying elements are uniformly dispersed in the Ag matrix, and a film having a uniform quality and stable characteristics may be obtained.

A sputtering target comprising either one or both of; In in an amount of larger than 2.0 atomic % and smaller than or equal to 2.7 atomic % is used for deposition of the Ag alloy film by the sputtering method. Moreover, a sputtering target further comprising Bi in an amount of larger than or equal to 0.01 atomic % and smaller than or equal to 2.0 atomic % is preferably used. An amount of Bi in the deposited Ag alloy film is smaller than an amount of Bi contained in a sputtering target used for the deposition. Considering a practical amount of Bi which can be contained in a sputtering target, approximately twice the amount of Bi to be contained in a deposited Ag alloy film was comprised in a sputtering target in the present invention.

Examples of a method for producing the target include a vacuum melt-casting method and a powder sintering method. The vacuum melt-casting method is preferred from a view point of securing in-plane uniformity in composition and texture of target.

Next, the reflecting electrode or the interconnection electrode of the present invention is described. The structure of the reflecting electrode or the interconnection electrode of the present invention is not particularly limited as long as it comprises the Ag alloy film on a substrate and is ordinary used in the technical field of the present invention. That is, the reflecting electrode or the interconnection electrode of the present invention may be composed of a single layer of the Ag alloy film, or the Ag alloy film which is deposited on a substrate with a transparent conductive film (preferably an ITO or an IZO) formed directly on the opposite side of the substrate. The Ag alloy film may not be limited to that formed directly on the substrate but also may be formed on a TFT or an underlying transparent conductive film such as ITO on a substrate. Further alternatively, a transparent conductive film (preferably an ITO or an IZO) may be formed directly on or directly beneath the Ag alloy film.

Figure 1B:
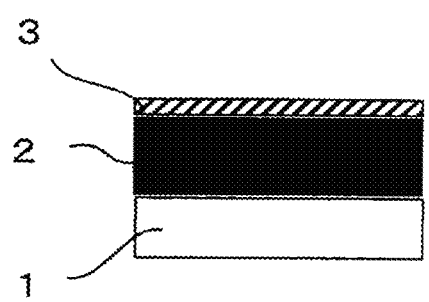
FIG. 1B A schematic cross-sectional figure indicating a structure of a reflecting electrode or an interconnection electrode according to the present invention. Illustrated is a structure in which a transparent conductive film is formed directly on an Ag alloy film formed on a substrate.
Figure 1C:
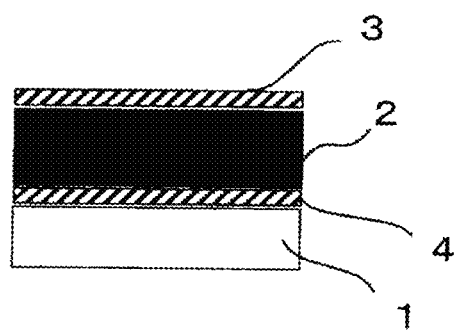
FIG. 1C A schematic cross-sectional figure indicating a structure of a reflecting electrode or an interconnection electrode according to the present invention. Illustrated is a structure in which transparent conductive films are formed directly on and directly beneath an Ag alloy film formed on a substrate.

The structures are illustrated as schematic cross-sections in FIGS. 1A to 1C. FIG. 1A indicates a structure in which an Ag alloy film 2 is formed directly on a substrate 1. FIG. 1B indicates a structure in which a transparent conductive film 3 is formed directly on an Ag alloy film 2 formed on a substrate 1. FIG. 1C indicates a structure in which transparent conductive films 3 and 4 are formed directly on and directly beneath an Ag alloy film 2 formed on a substrate 1. By forming the transparent conductive film, even higher resistance to oxidation as well as enhanced adhesion to the Ag alloy film and other layers via the transparent conductive film may be secured. The deposition method of the transparent conductive film is not particularly limited. The transparent conductive film may be deposited under a general condition such as a sputtering method.

A substrate used for the present invention is not particularly limited. Examples of such substrates are a glass and a resin such as PET (polyethylene terephthalate), or the like.

A kind of the transparent conductive film used for the present invention is not particularly limited. Examples of such films are ITO and IZO.

The transparent conductive film is not particularly limited in terms of film thickness. The transparent conductive film may have a normal range of thickness. The film thickness is, for example, preferably in a range from 5 nm or larger to smaller than 25 nm. The range is more preferably 7 nm or larger and 20 nm or smaller, and even more preferably 15 nm or smaller. Excellent resistance to oxidation may be secured by making the transparent conductive film 5 nm or thicker and decreasing defect area after an UV irradiation as measured in an embodiment described below. When the film thickness is 25 nm or larger, on the other hand, reflectance of a reflecting electrode or an interconnection electrode is liable to be decreased by an influence of optical characteristics of the transparent conductive film. A thickness of the transparent conductive film is preferably smaller than 25 nm, accordingly.

There may be a case in which the highly concentrated layer is formed at an interface between an Al alloy film and a transparent conductive film in a reflecting electrode or an interconnection electrode when a Ag—In—Bi film was employed for the reflecting electrode or the interconnection electrode as in the present invention. The "interface" represents a plane where the transparent conductive film and the Ag alloy film are contacting with each other. As a form of formation of the highly concentrated layer, there may be a case of FIG. 1B in which a highly concentrated layer (not shown in the figure) is formed between an Ag alloy film 2 and a transparent conductive film 3. There may also be a case of FIG. 1C in which a highly concentrated layer (not shown in the figure) is formed between an Ag alloy film 2 and a transparent conductive film 3. There may be another case in which a highly concentrated layer (not shown in the figure) is formed between an Ag alloy film 2 and a transparent conductive film 4.

The manufacturing method of the reflecting electrode or the interconnection electrode according to the present invention is not particularly limited. The Ag alloy film may be subjected to a heat treatment (post-annealing) after the formation of the transparent conductive film. The temperature of the post-annealing is preferably 200° C. or higher, and more preferably 250° C. or higher. It is preferably 350° C. or lower, and more preferably 300° C. or lower. The duration of the post-annealing is preferably about 10 minutes or longer, and more preferably about 15 minutes or longer. It is preferably about 120 minutes or shorter, and more preferably about 60 minutes or shorter.

In the present invention, experiments were carried out by using both a single layer Ag alloy film and a two-layer or three-layer laminate of Ag alloy with a transparent conductive film simulating various embodiments of a reflecting electrode or an interconnection electrode as illustrated in FIGS. 1A to 1C. Electrical resistivity, reflectance, and resistance to oxidation were evaluated for each of the samples as described in detail in examples mentioned below.

Each of the properties is specified as follows in the present invention.

"Electrical resistivity is low" is represented by a case which satisfies either (1) or (2) described below.

(1) In the Case of Single Layer of Ag Alloy Film

A single layer film sample is prepared by depositing an Ag alloy film of 100 nm in thickness in a method described in an embodiment below on a glass substrate. The sample is subjected to a heat treatment in a $N_2$ atmosphere at 250° C. for 1 hour. The electrical resistivity of the sample is measured by four-point probe method. If the measured electrical resistivity for the film is 8.1 μΩ-cm or smaller, it is evaluated as low electrical resistivity.

(2) In the Case of Three-Layer Laminate Film Comprising Ag Alloy Film and Transparent Conductive Film A laminate sample is prepared by depositing an ITO lower layer of 10 nm in thickness, an Ag alloy film of 100 nm in thickness, and an ITO upper layer of 10 nm in this order by a method described in an embodiment below on a glass substrate. The sample is subjected to a heat treatment in a $N_2$ atmosphere at 250° C. for 1 hour. The electrical resistivity of the laminate sample is measured by four-point probe method. If the measured electrical resistivity for the laminate is 6.0 μΩ-cm or smaller, it is evaluated as low electrical resistivity.

"Reflectance is high" is represented by a case which satisfies either (3) or (4) described below.

(3) In the Case of Single Layer of Ag Alloy Film

A single layer film sample is prepared by depositing an Ag alloy film of 100 nm in thickness in a method described in an embodiment below on a glass substrate. If a measured reflectance (initial reflectance) of the sample at a wavelength of 550 nm is 90% or larger, the film is evaluated as high reflectance.

(4) In the Case of Two-Layer Laminate Film Comprising Ag Alloy Film and Transparent Conductive Film A laminate film sample is prepared by depositing an Ag alloy film of 100 nm in thickness, and an ITO upper layer of 7 nm in this order in a method described in an embodiment below on a glass substrate. Each of the laminate films was subsequently subjected to a heat treatment at 250° C. for 1 hour in a nitrogen atmosphere. If a measured reflectance (initial reflectance) of the sample at a wavelength of 550 nm is 80% or larger, the film is evaluated as high reflectance.

"Resistance to oxidation is excellent" is represented by a case which satisfies either (5) or (6) described below.

(5) In the Case of Single Layer of Ag Alloy Film

A single layer film sample is prepared by depositing an Ag alloy film of 100 nm in thickness in a method described in an embodiment below. Then each of the samples is subjected to an UV irradiation at room temperature for 120 seconds in an air atmosphere. The reflectance of the respective sample at wavelength of 550 nm is evaluated by measuring the absolute reflectivity using a spectrophotometer (V-570 spectrophotometer manufactured by JASCO Corp.). When the variation in the measured reflectance in absolute value is 20% or smaller, the sample is evaluated as high resistance to oxidation.

(6) In the Case of Two-Layer Laminate Film Comprising Ag Alloy Film and Transparent Conductive Film A laminate film sample is prepared by depositing an Ag alloy film of 100 nm in thickness, and an ITO upper layer of 7 nm in this order in a method described in an embodiment below on a glass substrate. Each of the laminate films was subsequently subjected to an UV irradiation at room temperature for 120 seconds in an air atmosphere. When numbers and area of defects are measured after the UV irradiation and the number and the area of the defects (dark spots) per a given area of 120 mm×90 mm satisfy the standard below, the sample is evaluated as high resistance to oxidation.

The number of defects per the given area is 500 or less, preferably 350 or less, and more preferably 200 or less.

Moreover, the total area of the defects is 5,000 pixels or less with reference to the area of defects of 11,618 pixels of a pure Ag film. It is preferably 4,600 pixels or less, more preferably 4,000 pixels or less, and even more preferably 3,000 pixels or less.

The Ag alloy film for a reflecting electrode or an interconnection electrode according to the present invention is used in, for example, a liquid crystal display device, an organic EL display device such as a top-emission type OLED display panel, an inorganic EL display device, an organic EL lighting device, an inorganic EL lighting device, and a touch panel device.

A display device, a touch panel, a lighting device, or the like, which comprises a reflecting electrode or an interconnection electrode is subjected to various manufacturing processes. Conducted in one of the manufacturing processes is a cleaning process such as an UV irradiation or an $O_2$ plasma cleaning. As described above, Ag alloy films are generally liable to be oxidized in the course of the cleaning process. The Ag alloy film of the present invention has, however, high resistance to oxidation, and is able to suppress decreasing productivity of the devices.

EXAMPLES

The present invention is more specifically described below by presenting examples. The present invention is not limited to these examples described below. The present invention may be modified and performed without departing from the essence of the invention described above and below. They are also within the technological scope of the present invention.

(1) Sample Preparation
(1-1) Preparation of Single Layer Films

On a glass substrate (an alkali-free glass #1737 manufactured by Corning Inc., diameter: 50 mm, thickness: 0.7 mm) pure Ag or Ag alloy films having various alloy compositions indicated in Table 1 were deposited by sputtering method using a DC magnetron sputtering apparatus. The pure Ag and the Ag alloy films are sometimes collectively referred to as Ag alloy films hereinafter. The films were in the form of a single layer of 100 nm in thickness. The deposition conditions were as follows.

(Ag Alloy Film Deposition Condition)
Substrate temperature: room temperature
Sputtering power: 3.08 W/cm$^2$
Sputtering gas: Ar
Gas pressure: 1-3 mTorr
Anode-cathode distance: 55 mm
Deposition rate: 7.0-8.0 nm/sec
Base pressure: 1.0×10$^{-5}$ Torr or less A pure Ag target was used for the deposition of the pure Ag film. Used to deposit the Ag alloy films were Ag alloy sputtering targets prepared by a vacuum melt-casting method having the same composition as each of the films or composite targets having metal chips comprising the metal elements shown in Table 1 attached on the sputtering surface of a pure Ag target. It is noted here that the Ag alloy sputtering targets contained about twice of Bi in terms of the amount as compared with that of corresponding deposit when Bi was to be included in the films. Further alternatively, co-sputtering by simultaneously discharging metal targets constituting each of the film indicated in Table 1. The diameter of each of the targets was 4 inches.

Chemical compositions of the Ag alloy films thus obtained were quantitatively measured by using an inductively coupled plasma emission spectrometer (ICP-8000 manufactured by Shimadzu Corporation).

(1-2) Preparation of Two-Layer Laminate Film Sample Comprising Ag Alloy Film and Transparent Conductive Film Two-layer laminate film samples were prepared by laminating an ITO film on an Ag alloy film obtained by the method (deposition conditions for the Ag alloy films) described above. Specifically, an Ag alloy film of 100 nm in thickness was formed on a glass substrate, then an ITO film of 7 nm in thickness was successively formed by a method (deposition conditions for the ITO film) described below to obtain a two-layer laminate film sample of glass substrate\Ag 100 nm\ITO 10 nm.

(ITO Film Deposition Condition)
Substrate temperature: room temperature
Sputtering power: 1.85 W/cm$^2$
Sputtering gas: Ar gas mixed with 5%-Os
Gas pressure: 1-3 mTorr
Anode-cathode distance: 55 mm
Deposition rate: 0.2-0.3 nm/sec
Base pressure: 1.0×10$^{-5}$ Torr or less Each of the laminate films was subsequently subjected to a heat treatment at 250° C. for 1 hour in a nitrogen atmosphere using an infrared lamp heat treatment furnace RTP-6 available from ULVAC-RIKO, Inc., which was performed by simulating a post anneal in the course of manufacturing process.

(1-3) Preparation of Three-Layer Laminate Film Sample Comprising Ag Alloy Film and Transparent Conductive Film Three-layer laminate film samples were prepared by laminating ITO films by the above-described deposition method on top of as well as beneath an Ag alloy film obtained by the above-described deposition conditions. Specifically, an ITO film of 10 nm in thickness, an Ag alloy film of 100 nm in thickness, and an ITO film of 10 nm in thickness were successively formed on a glass substrate to obtain a three-layer laminate film sample of glass substrate\ITO 10 nm\Ag 100 nm \ITO 10 nm. Each of the laminate films was subsequently subjected to a heat treatment at 250° C. for 1 hour in a nitrogen atmosphere using an infrared lamp heat treatment furnace RTP-6 available from ULVAC-RIKO, Inc., which was performed by simulating a post anneal in the course of manufacturing process.

(2) Evaluation of Each of the Properties

Reflectance, electrical resistivity, and resistance to oxidation were evaluated for each of the single layer samples or the laminate with a transparent conductive film samples obtained in the above-described method. Details of the measurement methods are as described below.

(2-1) Measurement of Visible Reflectance of Ag Alloy Film at Wavelength of 550 nm The reflectance of the respective sample at wavelength of 550 nm was evaluated by measuring the absolute reflectivity using a spectrophotometer (V-570 spectrophotometer manufactured by JASCO Corp.). When the measured reflectance for a single layer film was 90% or larger, the sample was evaluated as high reflectance. When the measured reflectance for a laminate film was 80% or larger, the sample was evaluated as high reflectance.

(2-2) Measurement of Electrical Resistivity

The electrical resistivity of the respective sample thus obtained was measured by four-point probe method. If the measured electrical resistivity for a single layer laminate film was 8.1 μΩ-cm or smaller, it was evaluated as low electrical resistivity. If the measured electrical resistivity for a three-layer laminate film was 6.0 μΩ-cm or smaller, it was evaluated as low electrical resistivity.

(2-3) Evaluation of Resistance to Oxidation

Resistance to oxidation was evaluated in two ways as described in the following.

(2-3A) Measurement of Density of Defects Generated by UV Treatment (in Cases of Two-Layer Laminate Film Samples)

Each of the two-layer laminate films was subjected to an UV treatment in the UV treatment condition A described below. Deep UV Processor DUV-800-6 manufactured by GS Yuasa Lighting Ltd., was used for the UV treatment. Number and total area of defects (dark spots generated by oxidation of Ag) were measured in an optical micrograph taken at a magnification of 50 for the laminate film after the UV treatment. Image processing for the measurement was done by using analySIS® manufactured by Soft Imagin System GmbH. If the number of defects generated in the given area of 120 mm×90 mm is 500 or less and the total area of defects is 5,000 pixels or less with reference to the area of defects of 11,618 pixels of a pure Ag film, it was evaluated as excellent in terms of oxidation resistance.

(UV Treatment Condition A)
Low pressure mercury lamp
Test environment: air atmosphere
Central wavelength: 254 nm
UV irradiance: 40 mW/cm$^2$
Irradiation time: 30 minutes (2-3B) Measurement of Variation in Reflectance after UV Treatment (in Cases of Single Layer Film Samples)

Each of the single layer films was subjected to an UV irradiation using the LTV processor described in (2-3A) under the UV treatment condition B described below. The reflectance of the respective sample was measured before and after the UV irradiation at a wavelength of 550 nm by using a spectrophotometer (V-570 spectrophotometer manufactured by JASCO Corp.). When the variation in the measured reflectance in absolute value was 20% or smaller, the sample was evaluated as high resistance to oxidation.

(UV Treatment Condition B)
Low pressure mercury lamp
Test environment: air atmosphere
Central wavelength: 254 nm
UV irradiance: 40 mW/cm$^2$
Irradiation time: 60 seconds The results are summarized in Table 1 in which "OK" means acceptable and "NG" means unacceptable. The rightmost column in Table 1 is for total evaluation. When all of the criteria were satisfied, then the total evaluation was rated "OK". When any one of the criteria was not satisfied, then the total evaluation was rated "NG". In the table "-" represents that the evaluation was not performed.

TABLE 1

| | | Electrical resistivity | | | | Reflectance | | | |
|---|---|---|---|---|---|---|---|---|---|
| | | Single layer film (1) | | Two-layer laminate film (2) | | Single layer film (1) | | Two-layer laminate film (3) | |
| No. | Composition* | μΩ·cm | Evaluation | μΩ·cm | Evaluation | % | Evaluation | % | Evaluation |
| 1 | Ag | 2.90 | OK | — | — | 97.2 | OK | 97.8 | OK |
| 2 | Ag—0.8Zn | 4.30 | OK | — | — | 96.9 | OK | 97.1 | OK |
| 3 | Ag—1.1Zn | 4.80 | OK | — | — | 96.7 | OK | 97.2 | OK |
| 4 | Ag—1.3Zn | 5.00 | OK | — | — | 96.5 | OK | 97.0 | OK |
| 5 | Ag—2.1Zn | 6.30 | OK | — | — | 96.2 | OK | 96.6 | OK |
| 6 | Ag—3.2Zn | 6.60 | OK | — | — | 95.9 | OK | 94.5 | OK |
| 7 | Ag—4.2Zn | 8.20 | NG | — | — | 95.3 | OK | 93.6 | OK |
| 8 | Ag—0.1Bi—1.6Zn | 5.50 | OK | — | — | 95.5 | OK | 96.6 | OK |
| 9 | Ag—0.1Bi—1.47Zn | — | — | 4.90 | OK | 95.6 | OK | — | — |
| 10 | Ag—0.1Bi—2.88Zn | — | — | 5.61 | OK | 93.2 | OK | — | — |
| 11 | Ag—0.1Bi—3.5Zn | — | — | 6.00 | OK | 92.2 | OK | — | — |
| 12 | Ag—0.5In | 4.20 | OK | — | — | 97.0 | OK | 97.0 | OK |
| 13 | Ag—1.1In | 5.80 | OK | — | — | 96.4 | OK | 96.0 | OK |
| 14 | Ag—2.1In | 8.00 | OK | — | — | 95.2 | OK | 95.1 | OK |
| 15 | Ag—2.8In | 9.80 | NG | — | — | 94.1 | OK | 93.8 | OK |
| 16 | Ag—4.0In | 8.88 | NG | — | — | 93.2 | OK | 93.0 | OK |
| 17 | Ag—5.3In | 10.45 | NG | — | — | 92.6 | OK | 92.7 | OK |
| 18 | Aa—0.1Bi—2.0In | — | — | 5.50 | OK | 95.0 | OK | — | — |
| 19 | Ag—0.1Bi—2.5In | — | — | 5.70 | OK | 94.5 | OK | — | — |
| 20 | Ag—0.1Bi—3.0In | — | — | 6.20 | NG | 93.7 | OK | — | — |
| 21 | Ag—2.0Ge | 10.04 | NG | — | — | 94.8 | OK | 92.8 | OK |
| 22 | Ag—3.4Ge | 14.81 | NG | — | — | 93.1 | OK | 90.5 | OK |
| 23 | Ag—1.0Cu | 3.58 | OK | — | — | 97.3 | OK | 95.9 | OK |
| 24 | Ag—0.5Bi—0.5Ge | 3.40 | OK | — | — | 95.7 | OK | 95.8 | OK |
| 25 | Ag—0.5Bi—0.5Ge—0.5Cu | 3.80 | OK | — | — | 94.4 | OK | 94.9 | OK |

| | Resistance to oxidation in UV treatment | | | | | | | |
|---|---|---|---|---|---|---|---|---|
| | Single layer film (1) | | | | | | | |
| | Reflectance immediately after deposition % | Reflectance after UV irradiation % | Variation in reflectance % | | Two-layer laminate film (3) | | | |
| No. | | | | Evaluation | Number of defect Spots | Area Pixel | Evaluation | Total evaluation |
| 1 | 97.2 | 51.5 | 45.7 | NG | 572 | 11618 | NG | NG |
| 2 | — | — | — | — | 97 | 2036 | OK | OK |
| 3 | — | — | — | — | 175 | 2337 | OK | OK |

TABLE 1-continued

| | | | | | | | | |
|---|---|---|---|---|---|---|---|---|
| 4 | — | — | — | — | 181 | 2293 | OK | OK |
| 5 | — | — | — | — | 231 | 3901 | OK | OK |
| 6 | — | — | — | — | 60 | 1078 | OK | OK |
| 7 | — | — | — | — | 78 | 1223 | OK | NG |
| 8 | — | — | — | — | 166 | 2760 | OK | OK |
| 9 | 95.6 | 81.9 | 13.7 | OK | — | — | OK | OK |
| 10 | 93.2 | 79.2 | 14.0 | OK | — | — | OK | OK |
| 11 | 92.2 | 81.2 | 11.0 | OK | — | — | OK | OK |
| 12 | — | — | — | — | 136 | 3548 | OK | OK |
| 13 | — | — | — | — | 304 | 4544 | OK | OK |
| 14 | — | — | — | — | 80 | 1961 | OK | OK |
| 15 | — | — | — | — | 46 | 1488 | OK | NG |
| 16 | — | — | — | — | 41 | 772 | OK | NG |
| 17 | — | — | — | — | 309 | 5482 | NG | NG |
| 18 | 95.0 | 76.3 | 18.7 | OK | — | — | OK | OK |
| 19 | 94.5 | 77.7 | 16.8 | OK | — | — | OK | OK |
| 20 | 93.7 | 78.5 | 15.2 | OK | — | — | OK | NG |
| 21 | — | — | — | — | 157 | 4139 | OK | NG |
| 22 | — | — | — | — | 178 | 5218 | NG | NG |
| 23 | — | — | — | — | 267 | 7769 | NG | NG |
| 24 | — | — | — | — | 568 | 13522 | NG | NG |
| 25 | — | — | — | — | 348 | 6755 | NG | NG |

*The numerical values in this column represent atomic %.
(1): Substrate\Ag 100 nm
(2): Substrate\ITO 10 nm\Ag 100 nm\ITO 10 nm –> Heat treatment
(3): Substrate\Ag 100 nm\ITO 7 nm –> Heat treatment The results shown in Table 1 can be considered as follows. The Ag alloy films of Nos. 5, 6, 10, 11, 14, and 19 which satisfied the requirements of the present invention indicated the low electrical resistivity, the high reflectance, and the excellent resistance to oxidation.

No. 1 comprising pure Ag, on the other hand, was deteriorated in terms of resistance to oxidation although maintaining good electrical resistivity and reflectance.

Figure 2:
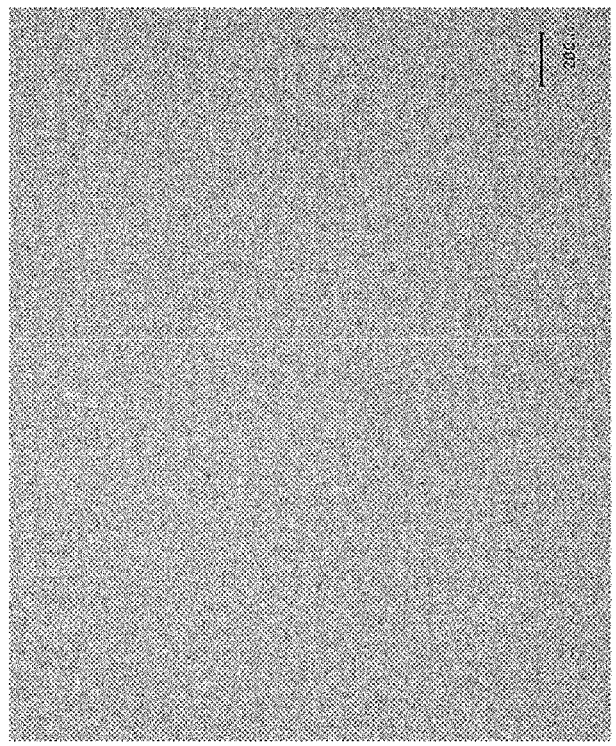
FIG. 2 Optical microscope images (magnification: ×50) of the surface of the laminated film of Example No. 1 (a comparative example) and No. 10 (an inventive example) after the UV treatment.
Figure 2:
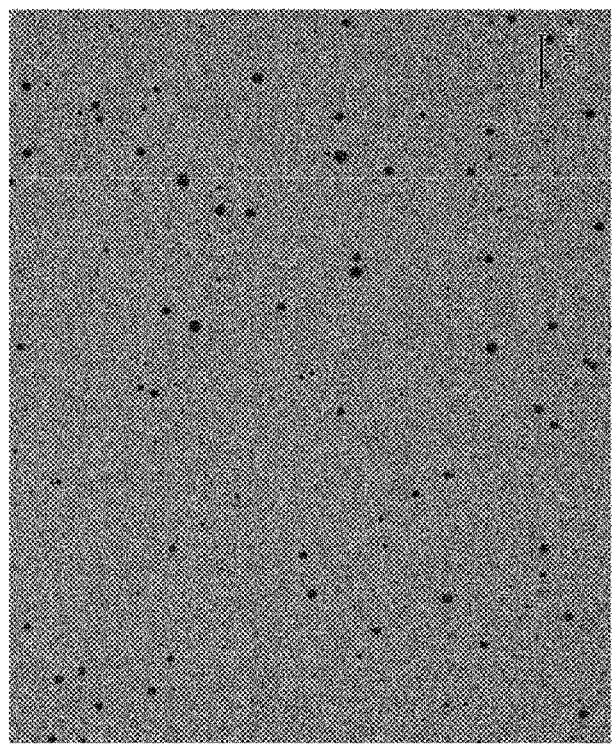

Optical microscope images of No. 1 (pure Ag) and No. 10 (a three-layer laminate film of Ag—0.1 atomic % Bi—2.88 atomic % Zn) after the UV treatment are shown in FIG. 2 for the reference. The UV irradiation was conducted in the same condition as above-described (UV treatment condition A).

Many dark defects generated by the oxidation of Ag were observed on the surface of the pure Ag film as shown in FIG. 2. On the other hand, such dark spots were hardly seen in No. 10, an inventive example of the present invention.

Nos. 2 to 7 were examples in which a content of Zn in Ag was varied in a range indicated in Table 1. Paying attention to the resistance to oxidation, the resistance to oxidation indicated a general trend of improvement as the content of Zn was increased. All of the samples Nos. 2 to 7 had the high reflectance as well. The electrical resistivity, on the other hand, was increased with the content of Zn.

Nos. 8 to 11 were examples in which Zn and Bi were added to Ag and a content of Zn was varied in a range indicated in Table 1. Paying attention to the resistance to oxidation, the resistance to oxidation indicated a general trend of improvement as the content of Zn was increased. All of these samples had the high reflectance as well.

Nos. 12 to 17 were examples in which a content of In in Ag was varied in a range indicated in Table 1. Paying attention to the resistance to oxidation, the resistance to oxidation indicated a general trend of improvement as the content of In was increased. The excellent resistance to oxidation was also observed in Nos. 15 and 16 even when the contents of In were higher than the upper limit specified in the present invention. The resistance to oxidation was deteriorated, however, when the content of In was extremely large as in No. 17. All of the samples Nos. 12 to 17 had the high reflectance as well. The electrical resistivity, on the other hand, was increased with the content of In, and exceeded the specification of the present invention in Nos. 15 to 17.

Nos. 18 to 20 were examples in which In and Bi were added to Ag and a content of In was varied in a range indicated in Table 1. Paying attention to the resistance to oxidation, the resistance to oxidation indicated a general trend of improvement in the similar manner as described above as the content of In was increased. The excellent resistance to oxidation was also observed in No. 20 even when the content of In was higher than the upper limit specified in the present invention. These samples had the high reflectance as well. The electrical resistivity, on the other hand, exceeded the specification of the present invention when the content of In was higher than the upper limit as in No. 20.

Nos. 21 to 25 were comparative examples in which one or more elements other than those specified in the present invention was added to Ag. As indicated in Table 1, either low electrical resistivity or the resistance to oxidation or both was not secured in these comparative examples.

Specifically, Nos. 20 and 21 were examples in which Ge was added as described in Patent Document 3. When the amount of Ge was 2.0 atomic % as in No. 21, the electrical resistivity was increased while the resistance to oxidation and the reflectance were excellent. When the amount of Ge was increased to 3.4 atomic % as in No. 22, the electrical resistivity was increased and the resistance to oxidation was deteriorated.

No. 24 was an example in which both Bi and Ge were added. When the amount of Ge was 0.5 atomic % even though Bi was added as in No. 24, the effect to improving the resistance to oxidation by adding Ge was not observed.

No. 23 was an example in which Cu was added. The resistance to oxidation was deteriorated when Cu was adding.

No. 25 was an example in which Cu was added to No. 24. The resistance to oxidation was deteriorated in No. 25 which contained Bi, Ge, and Cu.

It was demonstrated exceptionally useful from the results of Nos. 21 to 25 to add the elements particularly specified in the present invention to secure the excellent resistance to oxidation.

The present application has been explained in detail by referring to specific embodiment in the above. It is obvious for a person skilled in the art that various modifications and corrections can be made within the scope and the spirit of the present invention. The present application claims the benefit of priority based on Japanese Patent Application No. 2013-134344 filed on Jun. 26, 2013. The entire contents of the file are incorporated herein by reference.

INDUSTRIAL APPLICABILITY

The present invention is useful for applications to display devices such as a liquid crystal display, an organic EL display (for example, top-emission type OLED display), and an inorganic EL display; lighting devices such as an organic EL lighting device and an inorganic EL display; and touch panels.

REFERENCE SIGNS LIST

1 Substrate
2 Ag alloy film
3 Transparent conductive film (transparent conductive film formed directly on an Ag alloy film)
4 Transparent conductive film (transparent conductive film formed directly beneath an Ag alloy film)

The invention claimed is:

1. A reflecting electrode or an interconnection electrode, comprising:
   an Ag alloy film, and
   a transparent conductive film of 5 nm or larger and smaller than 25 nm in thickness formed directly on, or directly on and directly beneath, the Ag alloy film,
   wherein the Ag alloy film consists of In in an amount of larger than 2.0 atomic % and smaller than or equal to 2.7 atomic %, Bi in an amount of larger than or equal to 0.01 atomic % and smaller than or equal to 1.0 atomic %, and the balance being Ag and inevitable impurities.

2. The reflecting electrode or the interconnection electrode according to claim 1, wherein the transparent conductive film is either ITO or IZO.

3. A display device, comprising:
   the reflecting electrode according to claim 1.

4. A display device, comprising:
   the reflecting electrode according to claim 2.

5. A touch panel, comprising:
   the interconnection electrode according to claim 1.

6. A touch panel, comprising:
   the interconnection electrode according to claim 2.

7. A lighting device, comprising:
   the reflecting electrode according to claim 1.

8. A lighting device, comprising:
   the reflecting electrode according to claim 2.

* * * * *